(12) United States Patent
Afzali-Ardakani et al.

(10) Patent No.: US 8,912,525 B2
(45) Date of Patent: *Dec. 16, 2014

(54) CHEMICAL OXIDATION OF GRAPHENE AND CARBON NANOTUBES USING CERIUM (IV) AMMONIUM NITRATE

(75) Inventors: Ali Afzali-Ardakani, Armonk, NY (US); Bhupesh Chandra, Armonk, NY (US); George S. Tulevski, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

This patent is subject to a terminal disclaimer.

(21) Appl. No.: 13/329,115

(22) Filed: Dec. 16, 2011

(65) Prior Publication Data

US 2013/0153855 A1   Jun. 20, 2013

(51) Int. Cl.
*H01L 29/06* (2006.01)

(52) U.S. Cl.
USPC ............................ 257/9; 977/896; 977/847

(58) Field of Classification Search
CPC ............................................ H01L 21/02606
USPC .................... 257/1, 9; 977/847, 896
See application file for complete search history.

(56) References Cited

U.S. PATENT DOCUMENTS

| 7,151,146 | B1 | 12/2006 | Kwag et al. | |
|---|---|---|---|---|
| 7,253,431 | B2 | 8/2007 | Afzali-Ardakani et al. | |
| 2006/0055392 | A1* | 3/2006 | Passmore et al. | 324/71.1 |
| 2008/0001141 | A1 | 1/2008 | Gruner et al. | |
| 2009/0253590 | A1 | 10/2009 | Murakoshi et al. | |

FOREIGN PATENT DOCUMENTS

KR      20110005190      1/2011

OTHER PUBLICATIONS

John H. T. Luong et al., Oxidation, Deformation and Destruction of Carbon Nanotubes in Aqueous Ceric Sulfate, 2005, J. Phys. Chem. B, vol. 109, No. 4 pp. 1400-1407.*
D. Yang, et al.;Preparation of . . . multi-walled carbon nanotubes by Ce(IV . . . radical polymer.; Prog. in Nat. Sci. 19(2009) 991-96;Oct. 16, 2008; Ch Acad. of Sci.; CH.
D. Yang, et al.; Hydrothermal treatment to prepare hydroxyl . . . carbon nanotubes; J. of Mat. Chem.; Nov. 22, 2007; pp. 350-354; Roy. Soc. of Chem.; GB.
J.M.Simmons, et al.; Effect of Oxidation on Single-walled Carbon Nanotubes; J. Phys. Chem. B 2006. 110, 7113-18. Mar. 18, 2006;JACS; US.
Nicholas Mole; Combined Search and Examination Report; Great Britain Intellectual Property Office; Apr. 26, 2013; 6pp.
J.Y. Luong, et al.; Oxidation, Deformation, and Destruction of Carbon Nanotubes in Aqueous Ceric Sulfate: J.Phys.Chem.B2005. 109; Jan. 8, 2005; pp. 1400-1407; Amer. Chem. Soc.US.

* cited by examiner

*Primary Examiner* — Yu-Hsi D Sun
(74) *Attorney, Agent, or Firm* — Robert J. Eichelburg; The Law Offices of Robert J. Eichelburg

(57) ABSTRACT

A process comprises combining a Ce (IV) salt with a carbon material comprising CNT or graphene wherein the Ce (IV) salt is selected from a Ce (IV) ammonium salt of a nitrogen oxide acid and is dissolved in a solvent comprising water. The process is conducted under conditions to substantially oxidize the carbon material to produce an oxidized material that is substantially non-conducting. After the oxidation, the Ce (IV) is substantially removed from the oxidized material. This produces a product made by the process. An article of manufacture comprises the product on a substrate. The oxidized material can be formed as a pattern on the substrate. In another embodiment the substrate comprises an electronic device with the oxidized material patterning non-conductive areas separate from conductive areas of the non-oxidized carbon material, where the conductive areas are operatively associated with the device.

25 Claims, 2 Drawing Sheets

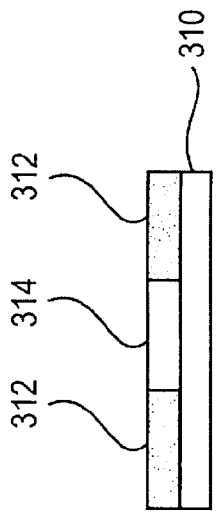
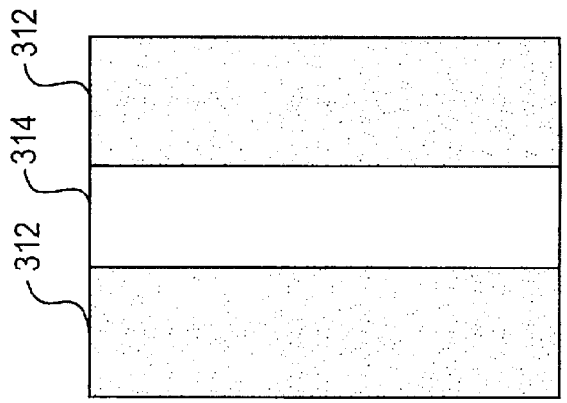
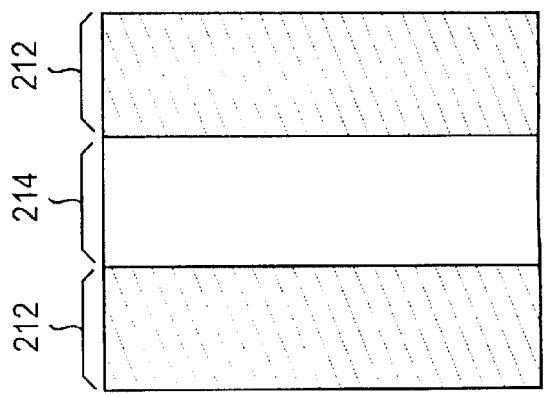

CHEMICAL OXIDATION OF GRAPHENE AND CARBON NANOTUBES USING CERIUM (IV) AMMONIUM NITRATE

FIELD OF THE INVENTION

The field of the invention comprises chemical oxidation of carbon nanotubes and graphenes.

BACKGROUND OF THE INVENTION

Graphene and carbon nanotubes (CNTs) are potential candidates for replacing silicon in electronic devices such as logic devices. Due to their high conductivities, these materials also find use as transparent conductors, competing with traditional conducting oxides for use in electronic devices such as photovoltaics, displays, organic light-emitting diodes (OLEDs) and the like. One essential step in making any electronic device is the patterning of material through etching. This process defines the active device area for electrical transport. For graphene and nanotubes, the most common way of patterning is through the use of oxygen plasma which etches these carbon materials. This process is costly and time consuming due to requirements of vacuum and plasma power and does not result in well-defined chemistry at the edges. Moreover such process requires a photolithography step to protect the device area before etching.

In recent years, manufacturing of carbon based devices has been demonstrated using ink-jet printing, stamping using poly dimethyl siloxane (PDMS), and self assembly. This decreases the cost significantly, however one bottleneck has always been the carbon etching step which is still done with oxygen plasma that increases the overall cost of manufacturing. Oxygen plasma is inherently non-controllable, leaving various functional groups on the exposed portion of the graphene. With the electronic industry looking forward to build medium performance, low cost electronic devices form graphene and CNTs, it is important to find processes which can pattern these materials without plasma treatment.

RELATED ART

The following documents show the state of the art in the field of chemical oxidation of carbon nanotubes and graphenes:
J. H. T. LUONG et al., "Oxidation, Deformation, and Destruction of Carbon Nanotubes in Aqueous Ceric Sulfate," J. Phys. Chem. B, Vol. 109, No. 4, 2005, pp 1400-1407, Web Publication Date Jan. 8, 2005;
J. M. SIMMONS et al., "Effect of Ozone Oxidation on Single-Walled Carbon Nanotubes," J. Phys. Chem. B, 2006, Vol. 110, No. 14, pp 7113-7118, Web Publication Date, Mar. 18, 2006;
D. YANG et al., "Hydrothermal treatment to prepare hydroxyl group modified multi-walled carbon nanotubes," J. Mater. Chem., Vol. 18, 2008, pp. 350-354, Web Publication Date 22 Nov. 2007;
D. YANG et al., "Preparation of water-soluble multi-walled carbon nanotubes by Ce(IV)-induced redox radical polymerization," Progress in Natural Science, Vol. 19, 2009, pp. 991-996;
Schlogl, et al., United States Published Patent Application 2009/0220767;
Ito, et al., United States Published Patent Application 2004/0043219;
Sarkar, et al. United States Published Patent Application 2008/0213367;
Ma, et al., United States Published Patent Application 2006/0142149;
Feng, et al., United States Published Patent Application 2009/0301993;
Niu, et al., U.S. Pat. No. 6,872,681;
Gorobinsky, et al. U.S. Pat. No. 7,838,159.

SUMMARY OF THE INVENTION

The present invention provides compounds, compositions, structures, articles of manufacture and processes that address the foregoing needs to not only provide advantages over the related art, but also to substantially obviate one or more of the foregoing and other limitations and disadvantages of the related art.

To achieve these and other advantages, and in accordance with the purpose of the invention as embodied and broadly described herein, the invention comprises the use of Ce (IV) salts for the chemical oxidation of both carbon nanotubes and graphene.

In other embodiments, the invention comprises a process of combining a Ce (IV) salt with a carbon material comprising CNT or graphene wherein the Ce (IV) salt is selected from a Ce (IV) ammonium salt of a nitrogen oxide acid and is dissolved in a solvent comprising water. The process is conducted for a period of time and at a temperature and solution concentration sufficient to substantially oxidize the carbon material to produce an oxidized material that is substantially non-conducting. After the oxidation, the Ce (IV) is substantially removed from the oxidized material. This produces a product made by the process. An article of manufacture comprises the product on a substrate. The oxidized material can be formed as a pattern on the substrate. In another embodiment the substrate comprises an electronic device with the oxidized material patterning non-conductive areas separate from conductive areas of the non-oxidized carbon material, where the conductive areas are operatively associated with and supply electrical current to the device.

BRIEF DESCRIPTION OF THE DRAWINGS

The accompanying graph (plot) and drawings set out the invention, and are incorporated in and constitute a part of this specification and are included to illustrate various embodiments of the invention, and together with this specification also serve to explain the principles of the invention. The drawings, however, are not necessarily drawn to scale.

FIG. 2A comprises a side elevation in cross-section of a an article of manufacture comrising a substrate populated with a carbon material comprising carbon nanotubes and a region where the nanotubes are oxidized in accord with the process of the invention to form a pattern on the substrate that is substantially non-conductive, whereas FIG. 2B comprise a plan view of the article of manufacture of FIG. 2A.

FIG. 3A comprises a side elevation in cross-section of a an article of manufacture comprising a substrate covered with a carbon material comprising a graphene layer and a region where the graphene layer is oxidized in accord with the process of the invention to form a pattern on the substrate that is substantially non-conductive, whereas FIG. 3B comprise a plan view of the article of manufacture of FIG. 3A.

DETAILED DESCRIPTION OF THE INVENTION

Figure 1:
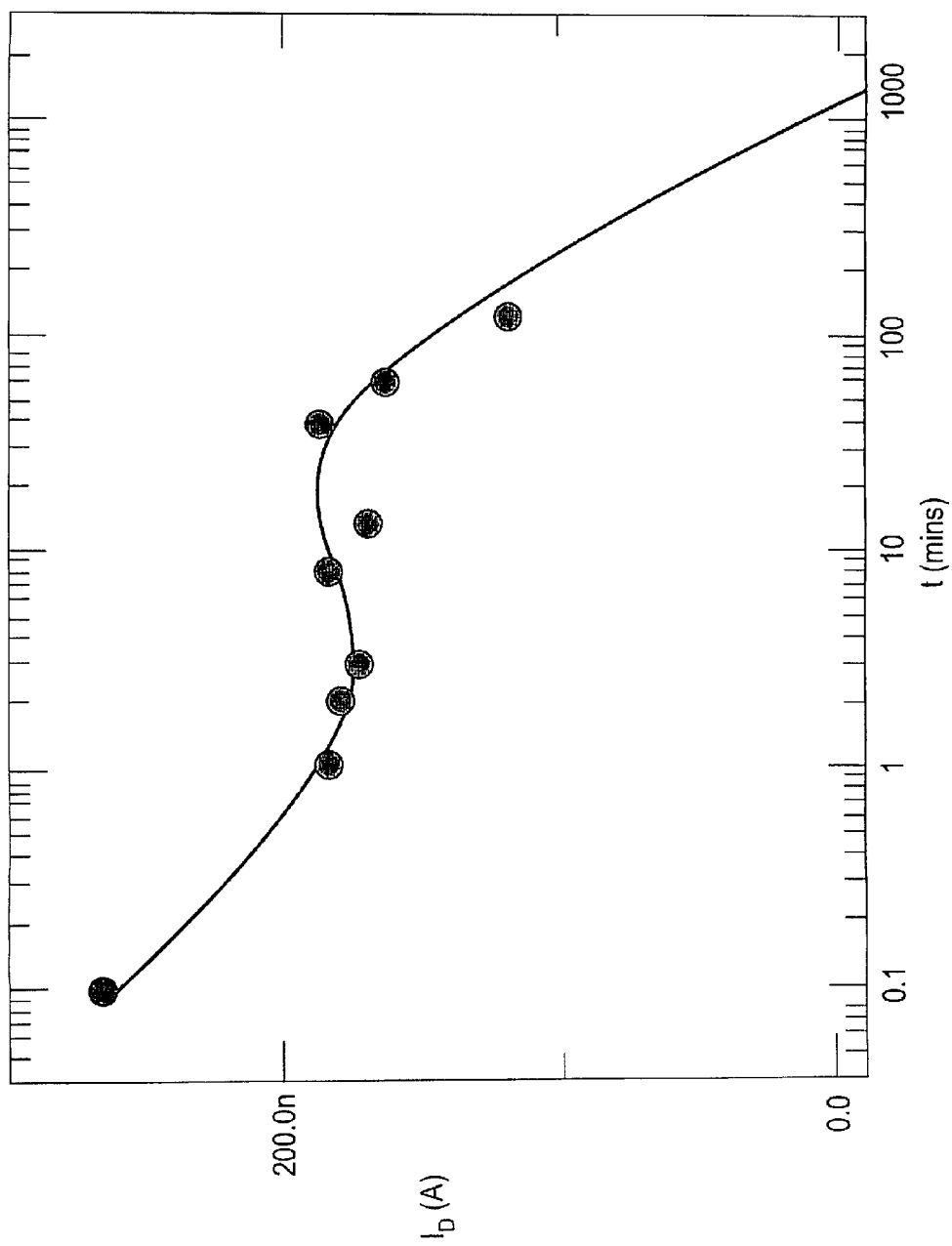
FIG. 1 comprises a plot showing the effect of cerium (IV) ammonium nitrate (CAN) oxidation on the ON current through a carbon nanotube field effect transistor (FED, where time in minutes is plotted as the abscissa, and the current ($I_D(A)$) as the ordinate, where the concentration of CAN is 1 mM in water. Other experiments show the time of complete oxidation of the nanotubes decreases significantly as the concentration of CAN is increased.

To achieve these and other advantages, and in accordance with the purpose of this invention as embodied and broadly described herein, the following detailed embodiments comprise disclosed examples that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. Not only do the written description, claims, abstract of the disclosure, and the drawings that follow set forth various features, objectives, and advantages of the invention and how they may be realized and obtained, but these features, objectives, and advantages will also become apparent by practicing the invention.

Cerium (IV) Ammonium Nitrate (CAN) is used to oxidize CNT and Graphene material. CAN is a very effective oxidizing agent. (Ce (IV) in this respect is a stronger oxidizing agent ($E°$~1.7 V vs. N.H.E.) than even Cl, ($E°$~1.36 V)). It undergoes reduction through one-electron transfer by an electron rich molecule. This compound is mostly commercially available and is prepared in one step from commercially available compounds. At moderately high concentrations (0.1 mM-100 mM) it reacts with CNT and graphene material and destroys the electronic structure responsible for electron transport. This makes treated regions of CNT and graphene insulating. CAN is water soluble, which makes it compatible with several other materials on the surface with carbon.

The substrates 210 and 310 In FIG. 2A and FIG. 3A comprise materials such as silicon, silicon oxides, polymeric materials such as polyimides or polyethylene glycol terephthalae and the art-known equivalents and provide a support for the conducting and non-conducting CNTs and graphene of the present invention for use in the manufacture of electronic devices, especially micro-electronic devices well known in the art.

In another aspect of the invention substrates 210 and 310 In FIG. 2A and FIG. 3A respectively may also comprise an electronic device such as semiconductor chips, semiconductor arrays, or wafers, or IC electronic components (integrated circuits, i.e.,"IC chips") and other components such as but not limited to micro-electro-mechanical (MEMS) components, passive filters, detector arrays, photovoltaic displays, organic light-emitting diodes (OLEDs) and the like or SiGe, a III-V electronic device, or opto-electronics, to be integrated as part of the electronic device system in the device level.

A III-V device comprises an electronic device based on at least one element selected from Group IIIB of the Periodic Table of Elements and at least one element selected from Group VB of the Periodic Table of Elements (IUPAC form). An example of these materials comprises GaAs. Ga is in column IIIB and As in column VB of the Periodic Table. III-V devices normally run faster (higher mobility) than Si or Ge devices. Both Si and Ge are in column IVB of the Periodic Table and have less stress in the bond, although the electronic devices of the invention may also comprise those based on the Group IVB elements.

EXAMPLES

Cerium Ammonium Nitrate (CAN) is mixed in deionized (DI) water at concentrations ranging from 0.1 mM-100 mM. The concentration required for the oxidizing reaction depends on the properties of material in question. For example, lower concentrations can be used to oxidize small diameter nanotubes (d~"0.8-1.2 nm), whereas high concentrations are required for large diameter nanotubes (d~1.2 to ~2 nm) and graphene.

A film of single walled carbon nanotubes (SWNTs) formed over any substrate (glass, silicon, plastic) using any nanotube film synthesis technique (CVD growth, spray deposition, vacuum fitiration) or a Graphene film formed over any substrate using any Graphene synthesis technique, is dipped in the CAN solution for 10 minutes to 10 hrs, depending upon of the concentration of the solution used. The film is taken out of the CAN solution and washed thoroughly with DI water. Multiwalled nanotubes (MWNTs) can also be used, with oxidation, at least, of the outermost wall of the MWNTs.

The foregoing steps can also be performed by stamping the CAN directly over the target areas on a chip containing CNT and/or graphene to form areas of conductive and non-conductive CNTs or graphene on the device. This stamping can be done by using polymer stamps based on polydimethylsiloxane (PDMS), ink-jet printing, brushing, screen printing and the like. The articles of manufacture of FIGS. 2A, 2B, 3A and 3B are assembled in this way.

FIG. 2A illustrates an article of manufacture comprising substrate 210 such as an electronic device having CNTs 212 and 214 operatively associated (e.g., an electrical connection or capacitive connection) with the substrate 210, wherein CNTs 214 have been oxidized in accord with the invention to provide a pattern of substantially non-conductive CNTs 214 on substrate 210. Again, FIG. 2B comprises a plan view of the article of manufacture of FIG. 2A.

FIG. 3A illustrates an article of manufacture comprising substrate 310 such as an electronic device having graphene regions 312 and 314 operatively associated (e.g., an electrical connection or capacitive connection) with the substrate 310, wherein graphene 314 has been oxidized in accord with the invention to provide a pattern of substantially non-conductive graphene 314 on substrate 310. Again, FIG. 3B comprises a plan view of the article of manufacture of FIG. 3A.

"Operatively associated" in this context describes the function of the non-oxidized carbon materials to conduct an electric current (i.e., "electrical transport," or "electron transport") across a substrate that is in some instances an electrical insulator or non-conductor of electricity. The term also applies to the placement of the conductive and non-conductive carbon materials in a pattern on these substrates and where the substrate comprises an electronic device, such as the electronic devices described herein, the conductance of an electric current across insulating surfaces of the electronic device to circuit components that make up the device such as resistors, capacitors, transistors, and the like, all of which are known in the art.

Ce (IV) salts, used according to the invention, e.g., Ce (IV) ammonium nitrate (CAN), Ce (IV) ammonium sulfate, Ce (IV) methylsulfonate and Ce (IV) trifluoromethanesulfonate, all of which are very effective oxidizing agents which undergo reduction by one-electron transfer with an electron rich substrate. These Ce (IV) salts are effective oxidants for both carbon nanotubes and graphene, and are mostly commercially available. Some are prepared in one step from commercially available compounds and all are soluble in water to a large extent.

Nitrite, —$NO_2$, or hyponitrite, —NO, salts can be substituted or used in lieu of the Ce (IV) ammonium nitrate (,i.e., the —$NO_3$ salt). This aspect the invention broadly comprises the use of Ce (IV) salts of a nitrogen oxide acid, or Ce (IV)

ammonium salts of a nitrogen oxide acid in the process of the invention and the products obtained using this process. The invention also comprises using mixtures of the foregoing salts.

Similarly, a salt of a sulfur oxide acid could be substituted for or used in lieu of the Ce (IV) ammonium sulfate. The non-Ce (IV) cations of these salts are well known in the art, but in one embodiment of the invention we employ ammonium cations. This aspect of the invention broadly comprises the use of Ce (IV) salts of a sulfur oxide acid, or Ce (IV) ammonium salts of a sulfur oxide acid in the process of the invention and the products obtained using this process. The invention also comprises using mixtures of the foregoing salts. Examples of these acids which are used to form these salts, and in one embodiment, the corresponding ammonium salts comprise inter alia:

sulfurous acid, $H_2SO_3$;
ammonium sulfite, $(NH4)_2SO_3$;
sulfuric acid, $H_2SO_4$;
ammonium sulfate, $(NH4)_2SO_4$;
thiosulfuric acid, $H_2S_2O_3$;
ammonium thiosulfate, $(NH4)_2SO_3$;
dithionus acid, $H_2S_2O_4$;
ammonium hyposulfite $(NH4)_2SO_4$;
metasulfinic acid, $H_2S_2O_5$;
ammonium metasulfite, $(NH4)_2SO_5$;
hyposulfuric acid, $H_2S_2O_6$;
ammonium hyposulfate, $(NH4)_2SO_6$;
pyrosulfuric acid, $H_2S_2O_7$;
ammonium pyrosulfate, $(NH4)_2SO_7$;
persulfuric acid, $H_2S_2O_8$; and
ammonium persulfate, $(N H4)_2SO_8$ The Ce (IV) salts, Ce (IV) methylsulfonate and Ce (IV) trifluoromethanesulfonate, generally comprise specific salts that may be employed according to the process of the invention although similar salts can be used including those comprising Ce (IV) lower alkyllsulfonate and Ce (IV) trihalo lower alkanesulfonate to obtain the products of the invention. The lower alkyl groups comprise from 1 to about 5 carbon atoms, including isomeric configurations thereof, such as methyl, ethyl, propyl, isopropyl, butyl, isobutyl, propyl, isopropyl and the like. The lower alkane groups in addition to the methane group, comprise those groups that contain from 1 to about 5 carbon atoms, including isomeric configurations thereof such as methane, ethane, propane, isopropane, butane, isobutane, pentane, isopentane and the like, where the alkane group can be fully substituted, e.g., perfluoro methane, or partially substituted, e.g., difluoromethane, difluoropentane, and the like. The halogen of the Ce (IV) halogenated lower alkanesulfonate can be any one of fluorine, chlorine, bromine, or iodine, or mixtures thereof where the alkane group is substituted by more than one halogen group.

Additionally, salts of an organo sulfur acid could be substituted for or used in the process of the invention in lieu of or as substitutes for the organo sulfonates, Ce (IV) lower alkyllsulfonate, (e.g., Ce (IV) methylsulfonate) and Ce (IV) halo lower alkane sulfonate, (e.g., Ce (IV) trifluoromethanesulfonate) to obtain the products using this process and comprise inter alia:

Sulfonates, $(R)(OH)SO_2$
Sulfinites, $(R)(OH)SO$;
Sulfones, $(R)(RO)SO$, and $(R)(R)SO_2$;
Sulfoxides, $(R)(R)SO$;
Sulfonium compounds, $(R)(R)(R)SX$;
Sulfinates, $(R)(R)SX_2$, where "R" can be the same or different and comprises a lower alkyl group or a substituted lower alkyl group, such as a halogen substituted lower alkyl having from 1 to about 5 carbon atoms and the isomers thereof such as isopropyl, isobutyl, isopentyl and the like, and "X" comprises an anion well known in the art, e.g., halogen, and can be the same or different for the compounds that include the radical "$X_2$." The invention also comprises using mixtures of these salts.

Combinations of any of the foregoing Ce (IV) salts are also used in practicing this invention.

In addition to dissolving the Ce (IV) salts of this invention in water, organic co-solvents may also be used with water and include ethanol, methanol, DMF, and acetonitrile in an amount of about 1% to about 50% by weight of the water. Combinations of these solvents are also employed in practicing the invention.

In another aspect of the invention, and in order to further describe the foregoing combining process and compound production, we define the invention as comprising compounds produced by the process of oxidizing the CNTs and graphene with the Ce (IV) salts of the invention as set out herein to produce CNTs and graphene having carboxyl groups. In another aspect, the invention comprises a product produced by the process of oxidizing CNTs and graphene with these Ce (IV) salts of the invention as set out herein, and rinsed, so that the product is substantially free of these Ce (IV) salts.

CNTs are produced according to processes well known in the art such as those described by Dimitrakopoulus and Georgiou U.S. Pat. No. 7,842,554 and the references cited therein. The properties of graphene, its uses, and methods for its manufacture are also well known in the art as exemplified by the following publications and the references cited therein:

Geim, A K and Novoselov, K S. (2007). "The rise of graphene". *Nature Materials* 6 (3): 183-191:

Geim A: (2009): "Graphene: Status and Prospects": *Science* 324 (5934): 1530:

Liying Jiao, Li Zhang, Xinran Wang, Georgi Diankov & Hongjie Dai (2009). "Narrow graphene nanoribbons from carbon nanotubes". *Nature* 458 (7240): 877:

Lemme, M. C. et al. (2007). "A graphene field-effect device". *IEEE Electron Device Letters* 28 (4): 282:

Bourzac, Katherine (2010-02-05). "Graphene Transistors that Can Work at Blistering Speeds". *MIT Technology Review:*

IBM shows off 100 GHz graphene *transistor-Techworld-.com. News.techworld.com.* Retrieved on 2010-12-10:

Lin et al.; Dimitrakopoulos, C; Jenkins, K A; Farmer, D B; Chiu, H Y; Grill, A; Avouris, P (2010). "100-GHz Transistors from Wafer-Scale Epitaxial Graphene". *Science* (Science) 327 (5966): 662:

Wang, X.; Li, X.; Zhang, L.; Yoon, Y.; Weber, P. K.; Wang, H.; Guo, J.; Dai, H. (2009). "N-Doping of Graphene Through Electrothermal Reactions with Ammonia". *Science* 324 (5928) 768:

Traversi, F.; Russo, V.; Sordan, R. (2009). "Integrated complementary graphene inverter". *Appl. Phys. Lett.* 94 (22):

Wang, X.; et al. (2007). "Transparent, Conductive Graphene Electrodes for Dye-Sensitized Solar Cells". *Nano Letters* 8 (1): 323:

These references also illustrate various substrates that can be used.

In further embodiments the Invention comprises a process for applying a Ce (IV) salt dissolved in a solvent comprising water to a carbon material comprising CNT or graphene wherein the Ce (IV)) salt is selected from a Ce (IV) caionc salt of a nitrogen oxide acid, Ce (IV) salt of a lower alkyl organo sulfur oxide acid, or Ce (IV) salt of a lower alkane organo sulfur oxide acid, where the process is conducted for a period of time and at a temperature and solution concentration sufficient to substantially oxidize the carbon material to produce an oxidized material that is substantially non-conducting, and after the oxidation the Ce (IV) is substantially removed from the oxidized material. We may conduct this process on a subatrate such as a CNT substrate or graphene substrate and in another embodiment use the process to form a pattern on the substrate. The substrate may compose an electronic device such as a semiconductor device, e.g., a FET device or a FET device based on graphene. The oxidized material separates non-conductive areas from conductive areas of the carbon material where the conductive areas are operatively associated with the electronic device to supply electrical current to the electronic device.

In the forgoing process the alkyl groups of the lower alkyl organo sulfur oxide acid may comprise alkyl groups having from 1 to about 5 carbon atoms, and the alkane groups of the lower alkane organo sulfur oxide acid comprise alkane groups having from 1 to about 5 carbon atoms. Furthermore, the Ce (IV) salt may comprises Ce (IV) ammonium nitrate, lower alkyllsutfonate, Ce (IV) trifluoro lower alkanesulfonate, e.g., Ce (IV) methylsulfonate or Ce (IV) Trifluoromethanesulfonate, and the carbon material, CNT or graphene.

In a another embodiment the process comprises applying Ce (IV) ammonium sulfate dissolved in a solvent comprising water to a carbon material comprising CNT or graphene where the process is conducted for a period of time and at a temperature and solution concentration sufficient to substantially oxidize the carbon material to produce an oxidized material that is substantially non-conducting, and after the oxidation the Ce (IV) is substantially removed from the oxidized material. We may also conduct this process on a substrate such as a CNT substrate or graphene substrate where the substrate may comprise a semiconductor device, e.g., a FET, such as a carbon nanotube FET, and the oxidized material separates non-conductive areas from conductive areas of the carbon material, and the conductive areas are operatively associated with the electronic device to supply electrical current to the electronic device.

Throughout this specification, and abstract of the disclosure, the inventors have set out equivalents, including without limitation combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher.

All scientific journal articles and other articles, including internet sites, as well as issued and pending patents that this written description or applicants' Invention Disclosure Statements mention including the references cited in such scientific journal articles and other articles, including Internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, and abstract of the disclosure.

Although the inventors have described their invention by reference to some embodiments, other embodiments defined by the doctrine of equivalents are intended to be included as falling within the broad scope and spirit of the foregoing written description, and the following claims, and abstract of the disclosure.

We claim:

1. A process comprising applying a Ce (IV) salt dissolved in a solvent comprising water to a carbon material comprising CNT or graphene wherein said Ce (IV) salt is selected from a Ce (IV) cationic salt of a nitrogen oxide acid, Ce (IV) salt of a lower alkyl organo sulfur oxide acid, or Ce (IV) salt of a lower alkane organo sulfur oxide acid where said process is conducted for a period of time and at a temperature and solution concentration sufficient to substantially oxidize said carbon material to produce an oxidized material that is substantially non-conducting, and after said oxidation said Ce (IV) is substantially removed from said oxidized material.

2. The process of claim 1 wherein the alkyl groups of said lower alkvl organo sulfur oxide acid comprise alkyl groups haying from 1 to about 5 carbon atoms, and the alkane groups of said lower alkane organo sulfur oxide acid comprise alkane groups having from 1 to about 5 carbon atoms.

3. The process of claim 1 wherein said Ce (IV) salt comprises Ce (IV) ammonium nitrate.

4. The process of claim 1 wherein said Ce (IV) salt comprises Ce (IV) lower alkyllsulfonate or Ce (IV) trifluoro lower alkanesulfonate.

5. A process comprising applying Ce (IV) ammonium sulfate dissolved in a solvent comprising water to a carbon material comprising CNT or graphene where the process is conducted for a period of time and at a temperature and solution concentration sufficient to substantially oxidize said carbon material to produce an oxidized material that is substantially non-conducting, and after said oxidation said Ce (IV) is substantially removed from said oxidized material.

6. The process of claim 1 wherein said Ce (IV) salt comprises Ce (IV) methylsulfonate.

7. The process of claim 1 wherein said Ce (IV) salt comprises Ce (IV) trifluoromethanesulfonate.

8. The process of claim 1 wherein said carbon material comprises a CNT.

9. The process of claim 1 wherein said carbon material comprises graphene.

10. The process of claim 5 where said process is carried out on a substrate.

11. The process of claim 10 where said substrate comprises a CNT substrate.

12. The process of claim 10 where said substrate comprises a graphene substrate.

13. The process of claim 1 where said process is carried out on a substrate.

14. The process of claim 8 where said process is carried out on a substrate.

15. The process of claim 9 where said process is carried out on a substrate.

16. The process of claim 14 where said oxidized material is formed as a pattern on a substrate.

17. The process of claim 16 wherein said substrate comprises an electronic device and said oxidized material separates non-conductive areas from conductive areas of said carbon material, and said conductive areas are operatively associated with said electronic device to supply electrical current to said electronic device.

18. The process of claim 17 wherein said electronic device comprises a semiconductor device.

19. The process of claim 18 wherein said semiconductor device comprises a FET.

20. The process of claim 19 wherein said semiconductor device comprises a carbon nanotube FET.

21. The process of claim 15 where said oxidized material is formed as a pattern on a substrate.

22. The process of claim 21 wherein said substrate comprises an electronic device and said oxidized material separates non-conductive areas from conductive areas of said carbon material, and said conductive areas are operatively associated with said electronic device to supply electrical current to said electronic device.

23. The process of claim 22 wherein said electronic device comprises a semiconductor device.

24. The process of claim 23 wherein said semiconductor device comprises a FET.

25. The process of claim 24 wherein said semiconductor device comprises a graphene semiconductor device.

\* \* \* \* \*